(12) United States Patent
Watanabe et al.

(10) Patent No.: US 9,571,101 B2
(45) Date of Patent: Feb. 14, 2017

(54) SEMICONDUCTOR DEVICE

(71) Applicant: KABUSHIKI KAISHA TOSHIBA, Minato-ku (JP)

(72) Inventors: Fumiya Watanabe, Yokohama (JP); Mikihiko Ito, Tokyo (JP); Masaru Koyanagi, Tokyo (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/846,025

(22) Filed: Sep. 4, 2015

(65) Prior Publication Data

US 2016/0352335 A1 Dec. 1, 2016

Related U.S. Application Data

(60) Provisional application No. 62/166,933, filed on May 27, 2015.

(51) Int. Cl.
*H03F 3/45* (2006.01)
*H03K 19/0185* (2006.01)
*H03F 3/16* (2006.01)

(52) U.S. Cl.
CPC ........ *H03K 19/018507* (2013.01); *H03F 3/16* (2013.01)

(58) Field of Classification Search
CPC .................................. H03F 3/45; H03F 1/42
USPC .................. 330/253, 257, 261, 292; 327/563
See application file for complete search history.

(56) References Cited

U.S. PATENT DOCUMENTS

| | | | |
|---|---|---|---|
| 2009/0091389 A1* | 4/2009 | Koike | H03F 3/45237 330/257 |
| 2009/0267128 A1 | 10/2009 | Maejima | |
| 2009/0268522 A1 | 10/2009 | Maejima | |
| 2010/0207195 A1 | 8/2010 | Fukuzumi et al. | |
| 2011/0284946 A1 | 11/2011 | Kiyotoshi | |
| 2016/0036397 A1 | 2/2016 | Watanabe et al. | |

* cited by examiner

*Primary Examiner* — Steven J Mottola
(74) *Attorney, Agent, or Firm* — Oblon, McClelland, Maier & Neustadt, L.L.P.

(57) ABSTRACT

According to one embodiment, a semiconductor device includes: a first circuit including a first transistor, a second transistor, the first and second transistors being capable of receiving first and second signals, respectively; a second circuit including a third transistor and a fourth transistor, a gate and one end of the third transistor being connected to one end of the first transistor, the fourth transistor being capable of receiving the first signal, one end of the fourth transistor being connected to the other end of the third transistor; and a third circuit configured to charge or discharge a node being connected to the one end of the first transistor according to the first signal.

19 Claims, 11 Drawing Sheets

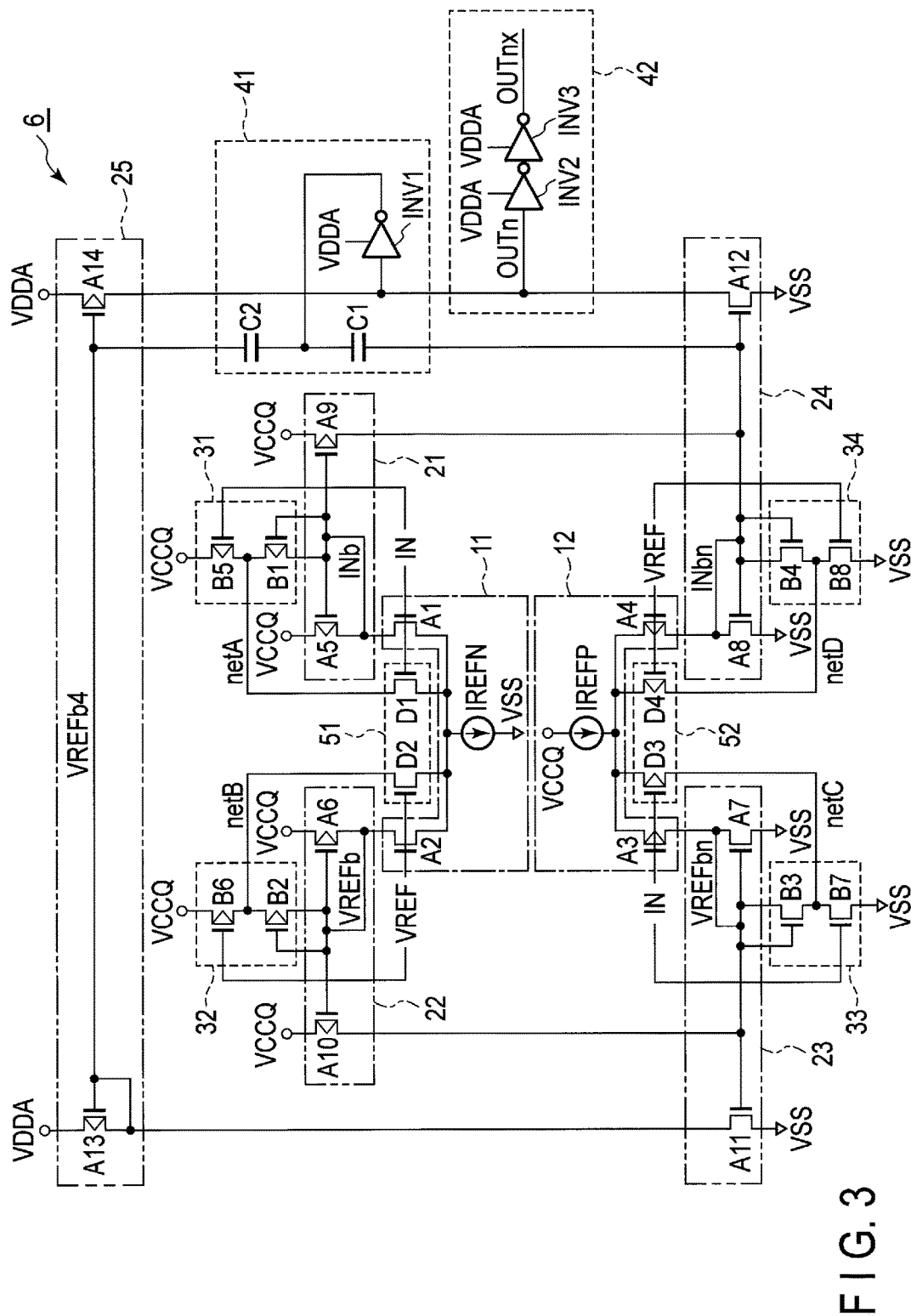
F I G. 3

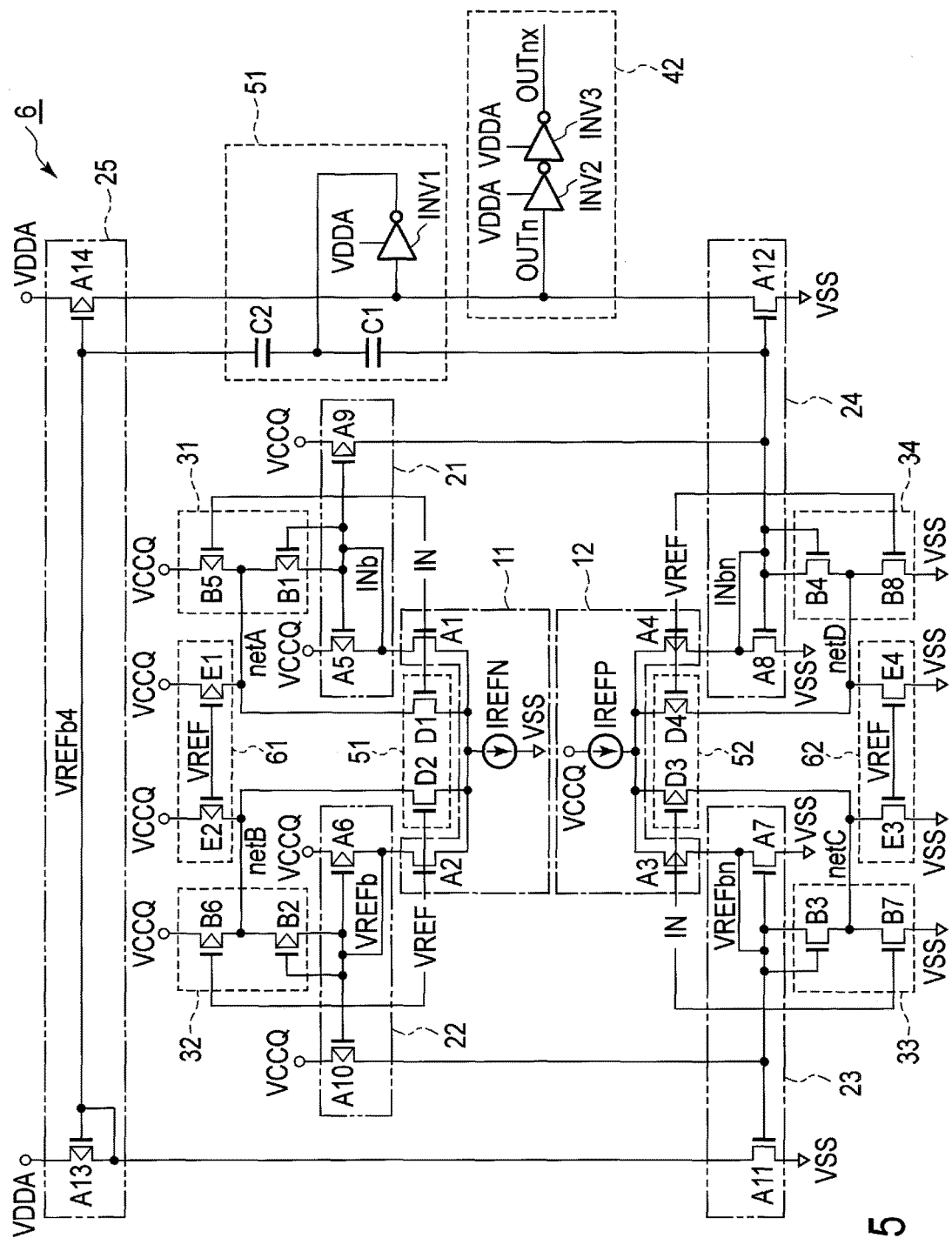
F I G. 5

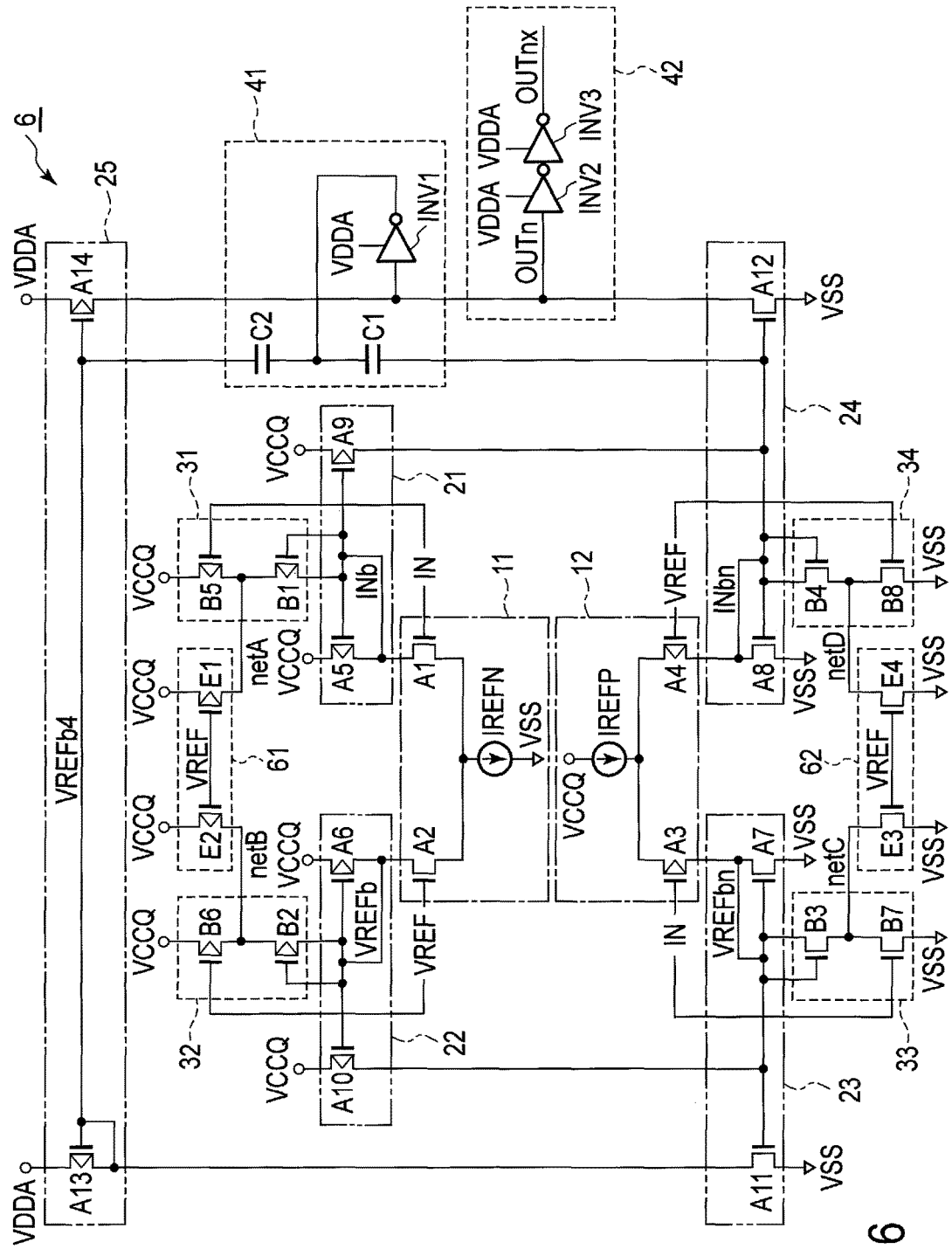
F I G. 6

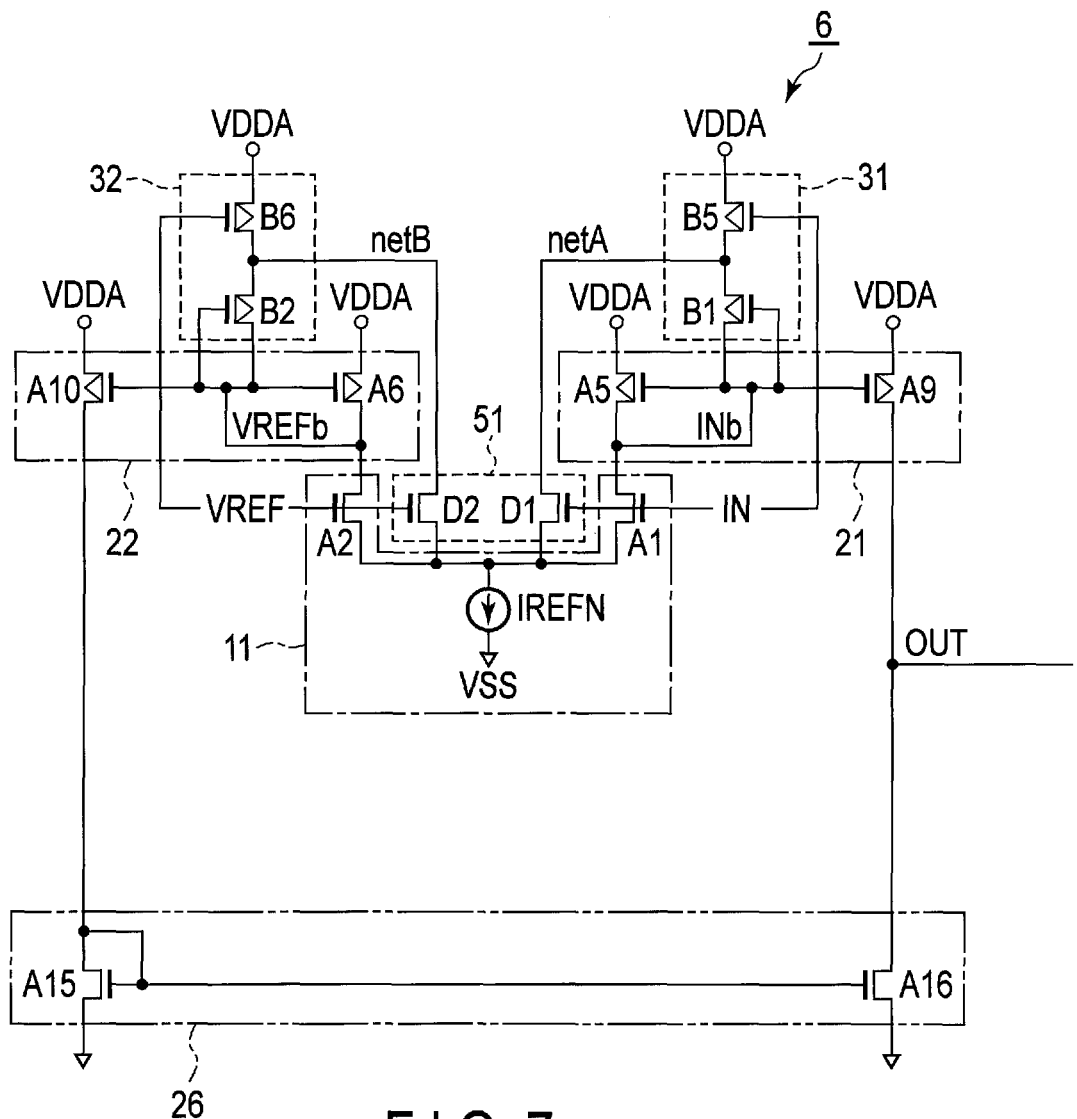
F I G. 7

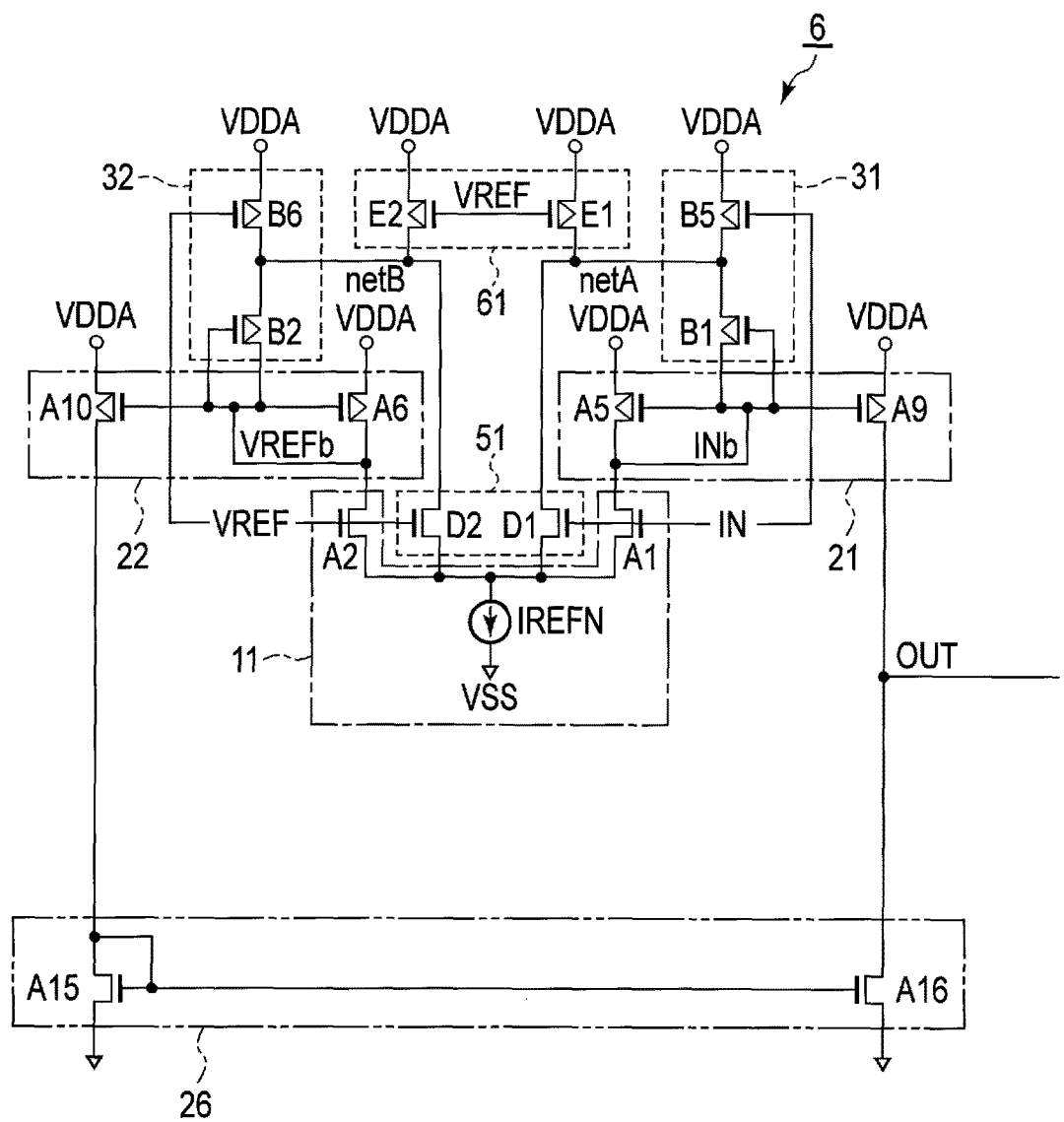
F I G. 9

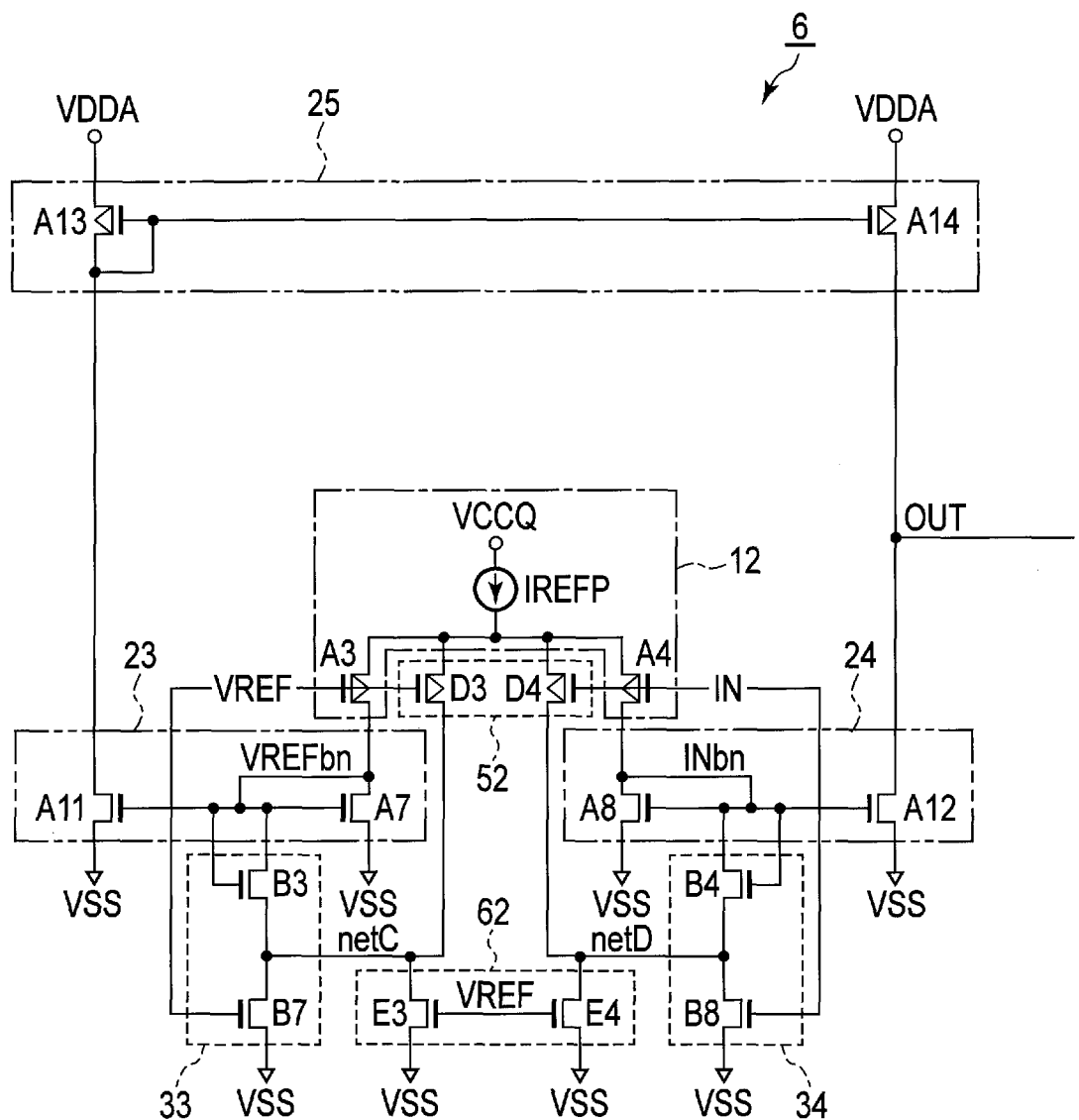
F I G. 10

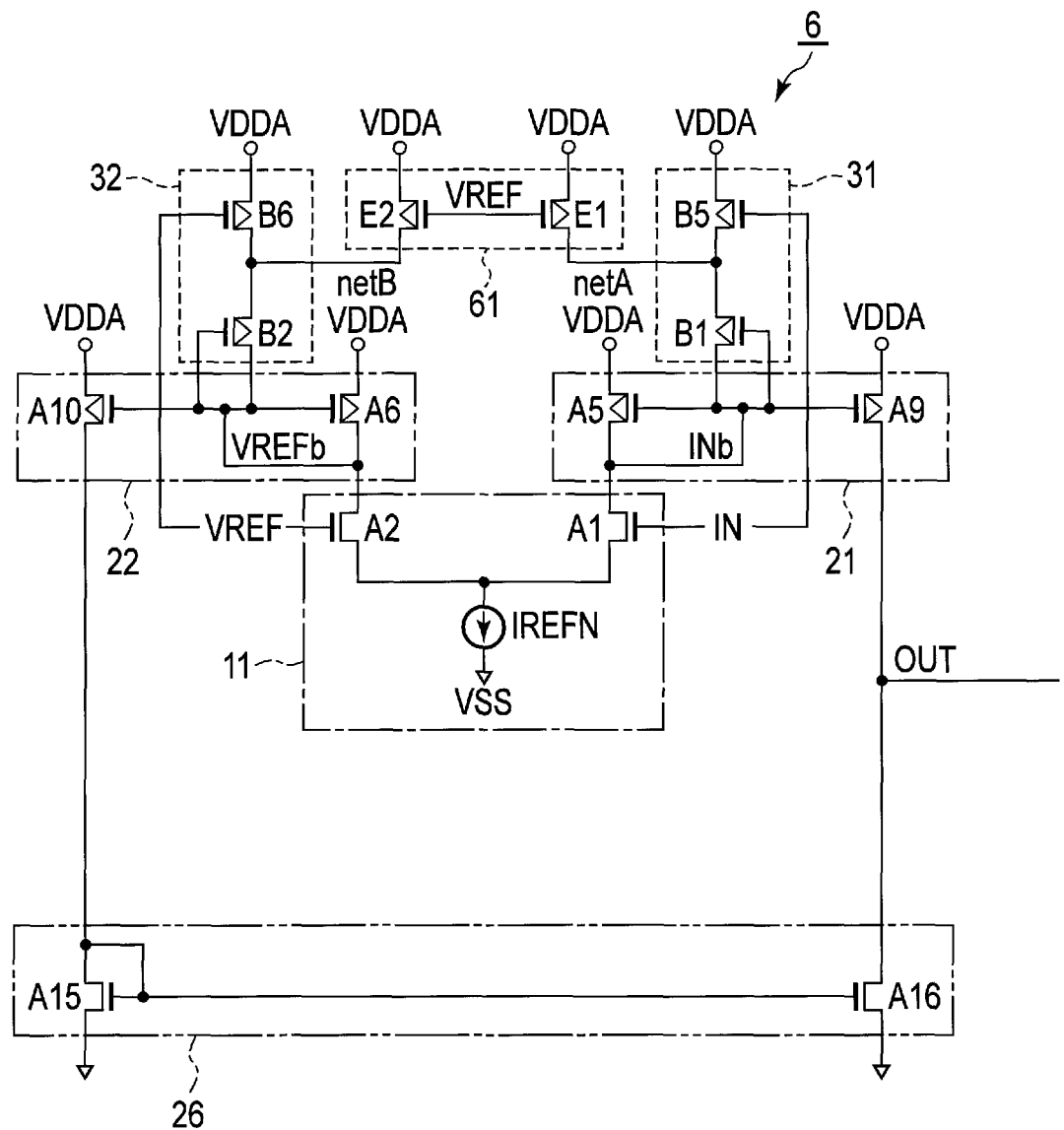
F I G. 11

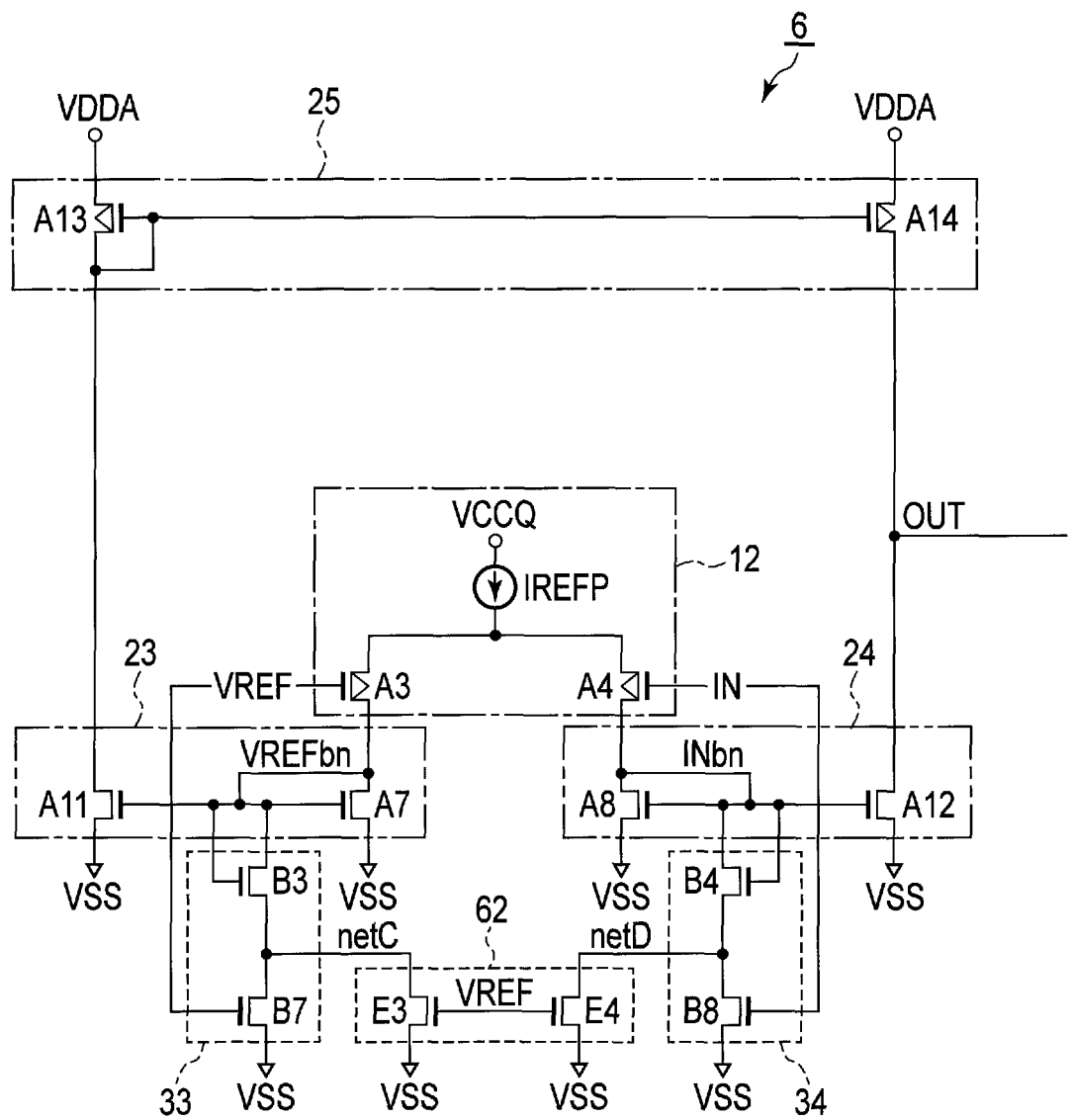
F I G. 12

SEMICONDUCTOR DEVICE

CROSS-REFERENCE TO RELATED APPLICATIONS

This application claims the benefit of U.S. Provisional Application No. 62/166,933, filed May 27, 2015, the entire contents of which are incorporated herein by reference.

FIELD

Embodiments described herein relate generally to a semiconductor device.

BACKGROUND

In a nonvolatile semiconductor storage device, an input buffer circuit is used.

BRIEF DESCRIPTION OF THE DRAWINGS

FIG. 3 is a circuit diagram of an amplifier circuit according to the first embodiment;

FIG. 5 is a circuit diagram of an amplifier circuit according to the second embodiment;

FIG. 6 is a circuit diagram of an amplifier circuit according to a third embodiment;

FIG. 7 and FIG. 8 are circuit diagrams of amplifier circuits according to a fourth embodiment;

FIG. 9 and FIG. 10 are circuit diagrams of amplifier circuits according to a fifth embodiment; and FIG. 11 and FIG. 12 are circuit diagrams of amplifier circuits according to a sixth embodiment.

DETAILED DESCRIPTION

In general, according to one embodiment, there is provided a semiconductor device comprising:

a first circuit including a first transistor of a first conductivity type, a second transistor of the first conductivity type and a constant current source, the first transistor being capable of receiving a first signal, the second transistor being capable of receiving a second signal, one end of the constant current source being electrically connected to one end of the first transistor and one end of the second transistor; a second circuit including a third transistor of a second conductivity type and a fourth transistor of the second conductivity type, a gate and one end of the third transistor being electrically connected to the other end of the first transistor, the fourth transistor being capable of receiving the first signal, one end of the fourth transistor being electrically connected to the other end of the third transistor; and a third circuit configured to charge or discharge a node being electrically connected to the one end of the first transistor according to the first signal.

Hereinafter, embodiments will be described with reference to the drawings. It should be noted that in the following descriptions, constituent elements having an substantially identical function and configuration are denoted by identical reference symbols.

[1] First Embodiment

[1-1] Configuration

Figure 1:
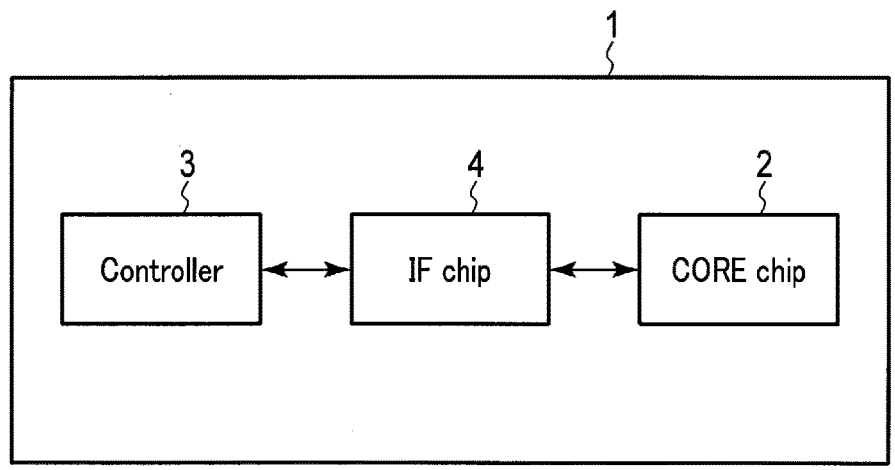
FIG. 1 is a block diagram of a semiconductor device according to a first embodiment.

A configuration example of a semiconductor device 1 according to a first embodiment will be described below by using FIG. 1.

The semiconductor device 1 includes a core chip 2, controller 3, and interface chip (IF chip) 4.

The core chip 2 is constituted of a nonvolatile memory, for example, a NAND flash memory or the like. The controller 3 controls the core chip 2 and IF chip 4 in response to an instruction from an external host device. For example, when the core chip 2 is a nonvolatile memory, the controller 3 instructs the core chip 2 to carry out read, write, erasure, and the like. The IF chip 4 is used for transfer/reception of data between the core chip 2 and controller 3.

Figure 2:
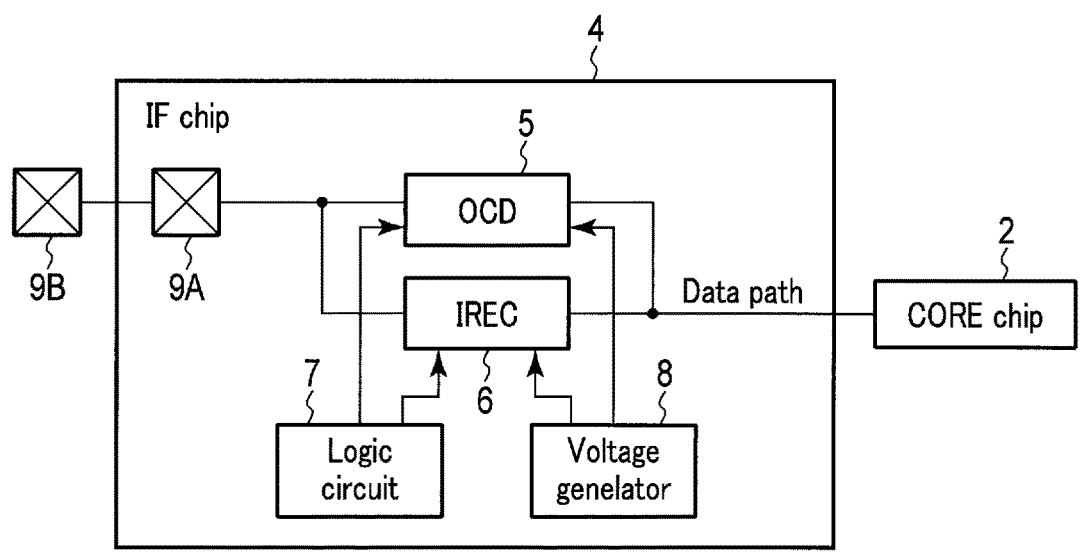
FIG. 2 is a block diagram of an interface chip according to the first embodiment.

A configuration example of an IF chip 4 according to the first embodiment will be described by using FIG. 2. FIG. 2 shows one terminal, and a circuit electrically connected thereto.

The IF chip 4 includes an off chip driver (OCD) 5, input receiver (IREC) 6, logic circuit 7, voltage generation circuit 8, and input/output terminal 9A. The OCD 5, and IREC 6 are provided according to the number of data paths.

The OCD 5 is an output resistance adjustment circuit, and is used as, for example, an output buffer circuit. The OCD 5 adjusts the output resistance of a signal sent from the core chip 2 to thereby output the signal to the controller 3.

The IREC 6 is an amplifier circuit, and is used as, for example, an input buffer circuit. The IREC 6 amplifies a signal sent from the controller 3, and inputs the amplified signal to the core chip 2.

The logic circuit 7 controls the OCD 5 and IREC 6. More specifically, at the time of data input, the logic circuit 7 causes the IREC 6 to operate, and causes the OCD 5 to stop. Thereby, data is sent from the controller 3 to the core chip 2 through the IREC 6. On the other hand, at the time of data output, the logic circuit 7 causes the OCD 5 to operate, and causes the IREC 6 to stop. Thereby, data is sent from the core chip 2 to the controller 3 through the OCD 5.

The voltage generation circuit 8 generates a voltage required to operate the OCD 5 and IREC 6, and applies the generated voltage to the OCD 5 and IREC 6.

The input/output terminal 9A is electrically connected to an input/output terminal 9B included in the controller 3. The input/output terminals 9A and 9B are provided according to the number of data paths.

The circuit configuration of the IREC 6 according to the first embodiment will be described below by using FIG. 3.

The IREC 6 is a two-input amplifier circuit. The IREC 6 includes amplifier circuits 11 and 12, current mirror circuits 21 to 25, input assist circuits 31 to 34, parasitic capacitance cancel circuit 41, output circuit 42, discharge circuit 51, and charge circuit 52.

The amplifier circuit 11 receives an input signal IN from outside by an N-type transistor, and differentially amplifies the input signal IN. The N-type transistor is, for example, an n-channel MOS transistor. The amplifier circuit 11 includes N-type transistors A1 and A2, and constant current source IREFN. In the N-type transistor A1, the input signal IN is supplied to a gate thereof. In the N-type transistor A2, a reference voltage VREF is applied to a gate thereof. In the constant current source IREFN, one end thereof is electrically connected to a source of the N-type transistor A1 and source of the N-type transistor A2, and the other end thereof is electrically connected to a ground terminal.

The amplifier circuit 12 receives an input signal IN by a P-type transistor, and differentially amplifies the input signal IN. The P-type transistor is, for example, a p-channel MOS transistor. The amplifier circuit 12 includes P-type transistors A3 and A4, and constant current source IREFP. In the P-type transistor A3, the input signal IN is supplied to a gate thereof. In the P-type transistor A4, a reference voltage VREF is applied to a gate thereof. In the constant current source IREFP, one end thereof is electrically connected to a source of the P-type transistor A3 and source of the P-type transistor A4, and the other end thereof is electrically connected to a power-supply terminal.

Each of the current mirror circuits 21 to 25 is constituted of two transistors, and a current flowing through one transistor is mirrored to the other transistor.

The current mirror circuit 21 includes P-type transistors A5 and A9. In the P-type transistor A5, a gate and a drain thereof are electrically connected to a drain of the N-type transistor A1, and a source thereof is electrically connected to a power-supply terminal. In the P-type transistor A9, a gate thereof is electrically connected to the gate of the P-type transistor A5, and a source thereof is electrically connected to a power-supply terminal. In the following descriptions, a node to which the P-type transistors A5 and A9 are electrically connected is to be referred to as the node INb.

The current mirror circuit 22 includes P-type transistors A6 and A10. In the P-type transistor A6, a gate and drain thereof are electrically connected to a drain of the N-type transistor A2, and a source thereof is electrically connected to a power-supply terminal. In the P-type transistor A10, a gate thereof is electrically connected to the gate of the P-type transistor A6, and a source thereof is electrically connected to a power-supply terminal. In the following descriptions, a node to which the P-type transistors A6 and A10 are electrically connected is to be referred to as the node VREFb.

The current mirror circuit 23 includes N-type transistors A7 and A11. In the N-type transistor A7, a gate and drain thereof are electrically connected to a drain of the P-type transistor A3, and a source thereof is electrically connected to a ground terminal. In the N-type transistor A11, a gate thereof is electrically connected to the gate of the N-type transistor A7, and a drain of the P-type transistor A10, and a source thereof is electrically connected to a ground terminal. In the following descriptions, a node to which the N-type transistors A7 and A11 are electrically connected is to be referred to as the node VREFbn.

The current mirror circuit 24 includes N-type transistors A8 and A12. In the N-type transistor A8, a gate and drain thereof are electrically connected to a drain of the P-type transistor A4, and a source thereof is electrically connected to a ground terminal. In the N-type transistor A12, a gate thereof is electrically connected to the gate of the N-type transistor A8, and a drain of the P-type transistor A9, and a source thereof is electrically connected to a ground terminal. In the following descriptions, a node to which the N-type transistors A8 and A12 are electrically connected is to be referred to as the node INbn. The current mirror circuit 25 includes P-type transistors A13 and A14. In the P-type transistor A13, a gate and drain thereof are electrically connected to a drain of the N-type transistor A11, and a source thereof is connected to a power-supply terminal. In the P-type transistor A14, a gate thereof is electrically connected to the gate of the P-type transistor A13, a drain thereof is electrically connected to a drain of the N-type transistor A12, and a source thereof is electrically connected to a power-supply terminal. In the following descriptions, a node to which the P-type transistors A13 and A14 are electrically connected is to be referred to as the node VREFb4.

Each of the input assist circuits 31 and 32 enlarges an amplitude of a signal amplified by the amplifier circuit 11 according to the level of the input signal IN.

Each of the input assist circuits 33 and 34 enlarges an amplitude of a signal amplified by the amplifier circuit 12 according to the level of the input signal IN.

The input assist circuit 31 includes P-type transistors B1 and B5. In the P-type transistor B1, a gate and drain thereof are electrically connected to a drain of the N-type transistor A1. In the P-type transistor B5, an input signal IN is supplied to a gate thereof, a drain thereof is electrically connected to a source of the P-type transistor B1, and a source thereof is electrically connected to a power-supply terminal. In the following descriptions, a node to which the P-type transistors B1 and B5 are electrically connected is to be referred to as the node netA.

The input assist circuit 32 includes P-type transistors B2 and B6. In the P-type transistor B2, a gate and drain thereof are electrically connected to a drain of the N-type transistor A2. In the P-type transistor B6, a reference voltage VREF is applied to a gate thereof, and a drain thereof is electrically connected to a source of the P-type transistor B2, and a source thereof is electrically connected to a power-supply terminal. In the following descriptions, a node to which the P-type transistors B2 and B6 are electrically connected is to be referred to as the node netB.

The input assist circuit 33 includes N-type transistors B3 and B7. In the N-type transistor B3, a gate and drain thereof are electrically connected to a drain of the P-type transistor A3. In the N-type transistor B7, an input signal IN is supplied to a gate thereof, a drain thereof is electrically connected to a source of the N-type transistor B3, and a source thereof is electrically connected to a ground terminal. In the following descriptions, a node to which the N-type transistors B3 and B7 are electrically connected is to be referred to as the node netC.

The input assist circuit 34 includes N-type transistors B4 and B8. In the N-type transistor B4, a gate and drain thereof are electrically connected to a drain of the P-type transistor A4. In the N-type transistor B8, a reference voltage VREF is applied to a gate thereof, a drain thereof is electrically connected to a source of the N-type transistor B4, and a source thereof is electrically connected to a ground terminal. In the following descriptions, a node to which the N-type transistors B4 and B8 are electrically connected is to be referred to as the node netD.

The parasitic capacitance cancel circuit 41 cancels the parasitic capacitance of each of the N-type transistor A12, and P-type transistor A14, and prevents a delay in the response of the output signal OUTn owing to the variation in the gate voltage of each of the N-type transistor A12 and P-type transistor A14 from occurring.

The parasitic capacitance cancel circuit 41 includes capacitors C1 and C2, and an inverter INV1. The capacitor C1 is electrically connected to the gate of the N-type transistor A12 at one end thereof. The capacitor C2 is electrically connected to the gate of the P-type transistor A14 at one end thereof, and is electrically connected to the other end of the capacitor C1 at the other end thereof. The inverter INV1 is electrically connected to the drain of the P-type transistor A14 at an input terminal thereof, and is electrically connected to the other end of the capacitor C1 at an output terminal thereof. A voltage value of the power-supply terminal of the inverter INV1 is, for example, VDDA.

The output circuit 42 receives an output signal OUTn, and outputs an output signal OUTnx to the outside of the IREC 6. The output circuit 42 includes inverters INV2 and INV3. The inverter INV2 is electrically connected to the drain of the P-type transistor A14 at an input terminal thereof. The inverter INV3 is electrically connected to an output terminal of the inverter INV2 at an input terminal thereof. The output signal OUTn is input to the inverter INV2, and the inverter INV3 outputs the output signal OUTnx. The voltage value of the power-supply terminal of each of the inverters INV2 and INV3 is, for example, VDDA.

The discharge circuit 51 discharges the nodes netA and netB according to the level of the input signal IN. The discharge circuit 51 includes N-type transistors D1 and D2. In the N-type transistor D1, an input signal IN is supplied to a gate thereof, a drain thereof is electrically connected to the node netA, and a source thereof is electrically connected to the one end of the constant current source IREFN. In the N-type transistor D2, the reference voltage VREF is applied to a gate thereof, a drain thereof is electrically connected to the node netB, and a source thereof is electrically connected to the one end of the constant current source IREFN.

The charge circuit 52 charges the nodes netC and netD according to the level of the input signal IN. The charge circuit 52 includes P-type transistors D3 and D4. In the P-type transistor D3, the input signal IN is supplied to a gate thereof, a drain thereof is electrically connected to the node netC, and a source thereof is electrically connected to one end of the constant current source IREFP. In the P-type transistor D4, a reference voltage VREF is applied to a gate thereof, a drain thereof is electrically connected to the node netD, and a source thereof is electrically connected to the one end of the constant current source IREFP.

It should be noted that the voltage value applied to the power-supply terminal electrically connected to the constant current source IREFP, and power-supply terminals electrically connected to the P-type transistors A5, A6, A9, A10, B5, and B6 is VCCQ. Here, VCCQ is, for example, 1.2 V or 1.8 V. The voltage value applied to the power-supply terminals electrically connected to the P-type transistors A13 and A14 is VDDA. Here, VDDA is, for example, 1.2 V. The voltage value applied to the ground terminal electrically connected to the constant current source IREFN, and ground terminals electrically connected to the N-type transistors A7, A8, A11, A12, B7, and B8 is VSS. Now, VSS is, for example, 0 V. The reference voltage VREF is, for example, VCCQ/2. The voltage values VCCQ, VDDA, and VSS are not limited to these values, and can be variously changed.

Further, the IREC 6 may be operated by interchanging the input signal IN and the reference voltage VREF with each other. The voltage applied to the gate of each of the N-type transistors D1 and D2, and P-type transistors D3 and D4 is not limited to the reference voltage VREF, and can be variously changed. Further, the voltage applied to the gate of each of the N-type transistors D1 and D2, and the voltage applied to the gate of each of the P-type transistors D3 and D4 may have voltage values different from each other.

[1-2] Operation

Figure 4:
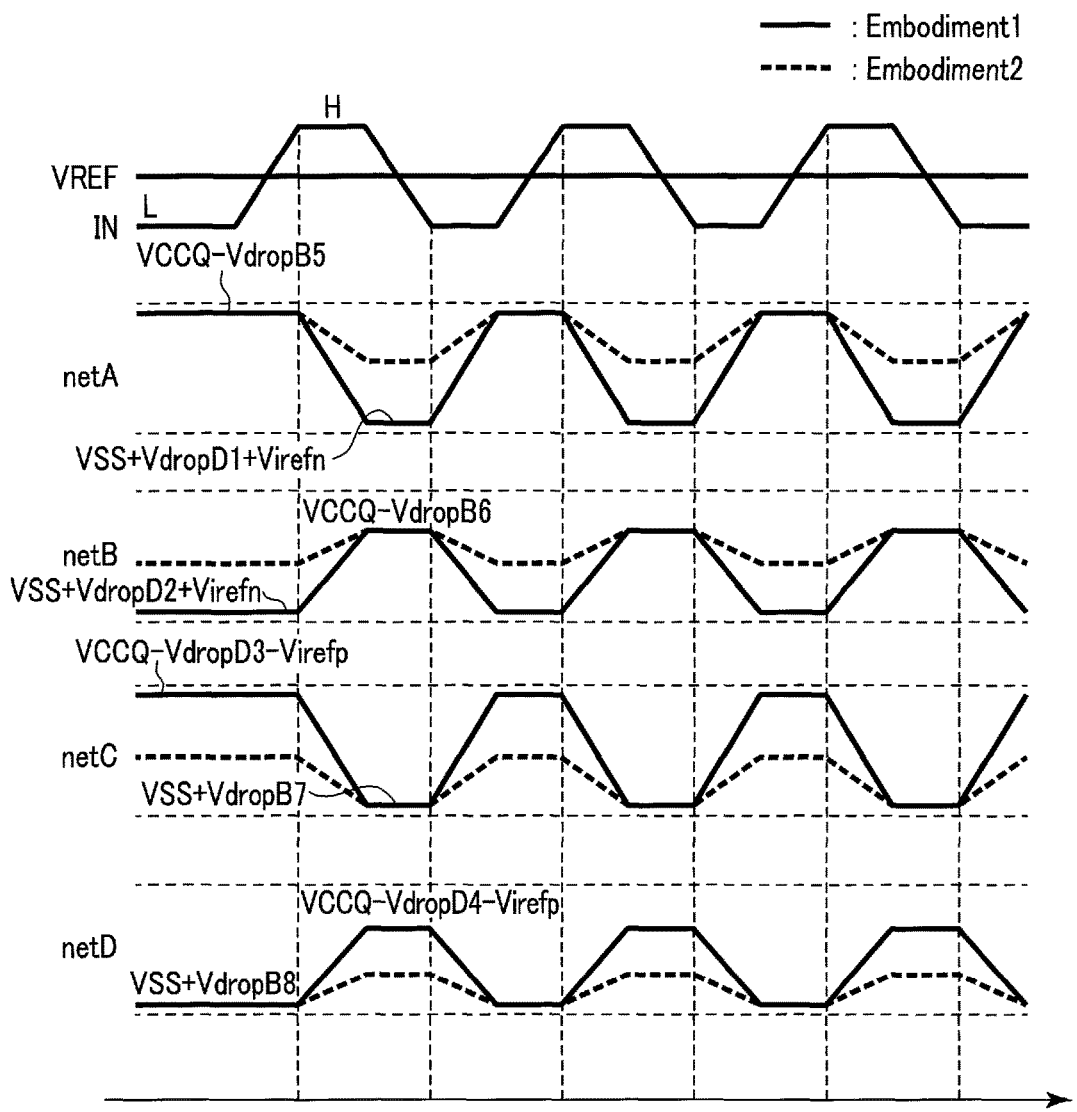
FIG. 4 is an operation conceptual view of an amplifier circuit according to the first embodiment and a second embodiment.

An operation of the IREC 6 according to the first embodiment will be described below by using FIG. 4. Solid lines shown in FIG. 4 indicate an example of variations in the voltages of the input signal IN, reference voltage VREF, and nodes netA, netB, netC, and netD at the time of an operation of the IREC 6 according to the first embodiment. In the following descriptions, a level "L" is a voltage at which an N-type transistor receiving a signal turns off, and a P-type transistor receiving a signal turns on. Further, a level "H" is a voltage at which an N-type transistor receiving a signal turns on, and a P-type transistor receiving a signal turns off.

When the input signal IN changes from the level "L" to the level "H", the N-type transistors D1 and B7 turn on, and the P-type transistors D3 and B5 turn off.

When the N-type transistor D1 turns on, a current flows from the node netA to the constant current source IREFN and, when the P-type transistor B5 turns off, no current flows from the power-supply terminal to the node netA. Thereby, the voltage of the node netA lowers from a value lower than VCCQ by a value corresponding to a voltage drop (VdropB5) of the transistor B5. Further, when the N-type transistor D1 turns on, a current flowing between the source and drain of the N-type transistor D2 decreases. Thereby, the voltage of the node netB rises from a value higher than VSS by a value corresponding to a voltage drop (VdropD2) of the transistor D2, and the voltage (Virefn) of the constant current source IREFN.

When the P-type transistor D3 turns off, no current flows from the constant current source IREFP to the node netC and, when the N-type transistor B7 turns on, a current flows from the node netC to the ground terminal. Thereby, the voltage of the node netC lowers from a value lower than VCCQ by a value corresponding to a voltage drop (VdropD3) of the transistor D3, and the voltage (Virefp) of the constant current source IREFP. Further, when the P-type transistor D3 turns off, a current flowing between the source and drain of the P-type transistor D4 increases. Thereby, the voltage of the node netD rises from a value higher than VSS by a value corresponding to a voltage drop (VdropB8) of the transistor B8.

On the other hand, when the input signal IN changes from the level "H" to the level "L", the N-type transistors D1 and B7 turn off, and the P-type transistors D3 and B5 turn on.

When the N-type transistor D1 turns off, no current flows from the node netA to the constant current source IREFN and, when the P-type transistor B5 turns on, a current flows from the power-supply terminal to the node netA. Thereby, the voltage of the node netA rises from a value higher than VSS by a value corresponding to a voltage drop (VdropD1) of the transistor D1, and the voltage (Virefn) of the constant current source IREFN. Further, when the N-type transistor D1 turns off, a current flowing between the source and drain of the N-type transistor D2 increases. Thereby, the voltage of the node netB lowers from a value lower than VCCQ by a value corresponding to a voltage drop (VdropB6) of the transistor B6.

When the P-type transistor D3 turns on, a current flows from the constant current source IREFP to the node netC and, when the N-type transistor B7 turns off, no current flows from the node netC to the ground terminal. Thereby, the voltage of the node netC rises from a value higher than VSS by a value corresponding to a voltage drop (VdropB7) of the transistor B7. Further, when the P-type transistor D3 turns on, a current flowing between the source and drain of the P-type transistor D4 decreases. Thereby, the voltage of the node netD lowers from a value lower than VCCQ by a value corresponding to a voltage drop (VdropD4) of the transistor D4, and the voltage (Virefp) of the constant current source IREFP.

It should be noted that an amount of the current that flows when the transistors B6 and D2 in which the reference voltage VREF is applied to the gates are in the on-state is smaller than an amount of the current that flows when the transistors B5 and D1 in which the input signal IN is supplied to the gates are in the on-state. Thereby, the amplitude of the node netB becomes smaller than the amplitude of the node netA. For the same reason, the amplitude of the node netD becomes smaller than the amplitude of the node netC.

[1-3] Advantage of First Embodiment

In the IREC 6, even when the input signal IN is at the level "H", there is sometimes a case where the P-type transistor B5 does not turn off when the threshold voltage of the transistor is low, and the input signal IN is a small-amplitude signal. At this time, a current flows from the power-supply terminal (voltage value=VCCQ) to the node netA, and a voltage difference occurs between the source and drain of the P-type transistor B1. Then, a current flows from the node netA to the node INb, and the current mirror ratio of the current mirror circuit 21 becomes smaller. Thereby, the amplification degree of the current mirror circuit 21 decreases, and hence the speed at which the node INbn is charged becomes lower, and the speed at which the current mirror circuit 24 discharges the node OUTn becomes lower.

Likewise, even when the input signal IN is at the level "L", there is sometimes a case where the N-type transistor B7 does not turn off. At this time, a current flows from the node netC to the ground terminal, and a voltage difference occurs between the source and drain of the N-type transistor B3. Then, a current flows from the node VREFbn to the node netC, and the current mirror ratio of the current mirror circuit 23 becomes smaller. Thereby, the amplification degree of the current mirror circuit 23 decreases, and hence the speed at which the node VREFb4 is charged becomes lower, and the speed at which the current mirror circuit 25 charges the node OUTn becomes lower.

As described above, in the IREC 6, there is sometimes a case where the speed at which the node OUTn is charged/discharged becomes lower, and a case where charge/discharge of the internal nodes is not completed within the period at the time of a high-speed operation.

Thus, the IREC 6 according to the first embodiment includes a discharge circuit 51 and charge circuit 52.

When the input signal IN is at the level "H", the discharge circuit 51 discharges the node netA. Thereby, even when the P-type transistor B5 does not turn off, and a current flows through the node netA, the voltage difference between the source and drain of the P-type transistor B1 becomes smaller, and the P-type transistor B1 turns off. As a result, the current mirror ratio of the current mirror circuit 21 does not become smaller, and hence the amplification degree of the current mirror circuit 21 configured to charge the node INbn is maintained.

When the input signal IN is at the level "L", the charge circuit 52 charges the node netC. Thereby, even when the N-type transistor B7 does not turn off, the voltage difference between the source and drain of the N-type transistor B3 becomes smaller, and the N-type transistor B3 turns off. As a result, the current mirror ratio of the current mirror circuit 23 does not become smaller, and hence the amplification degree of the current mirror circuit 23 configured to charge the node VREFb4 is maintained.

By virtue of the configuration described above, the IREC 6 according to the first embodiment can complete charge/discharge of the internal nodes within the period at the time of a high-speed operation.

[2] Second Embodiment

An IREC 6 according to a second embodiment includes a level adjustment circuit configured to adjust the voltage levels of the nodes netA, netB, netC, and netD. In the following, only points different from the first embodiment will be described.

[2-1] Configuration

The circuit configuration of the IREC 6 according to the second embodiment will be described below by using FIG. 5. The IREC 6 further includes level adjustment circuits 61 and 62.

The level adjustment circuit 61 is a charge circuit, and is configured to adjust the voltage levels of the nodes netA and netB. The level adjustment circuit 61 includes P-type transistors E1 and E2. In the P-type transistor E1, a reference voltage VREF is applied to a gate thereof, a drain thereof is electrically connected to the node netA, and a source thereof is electrically connected to a power-supply terminal. In the P-type transistor E2, the reference voltage VREF is applied to a gate thereof, a drain thereof is electrically connected to the node netB, and a source thereof is electrically connected to a power-supply terminal.

The level adjustment circuit 62 is a discharge circuit, and is configured to adjust the voltage levels of the nodes netC and netD. The level adjustment circuit 62 includes N-type transistors E3 and E4. In the N-type transistor E3, a reference voltage is applied to a gate thereof, a drain thereof is electrically connected to the node netC, and a source thereof is electrically connected to a ground terminal. In the N-type transistor E4, the reference voltage VREF is applied to a gate thereof, a drain thereof is electrically connected to the node netD, and a source thereof is electrically connected to a ground terminal.

It should be noted that the voltage value applied to the power-supply terminals respectively electrically connected to the P-type transistors E1 and E2 is VCCQ. The voltage value applied to the ground terminals respectively electrically connected to the N-type transistors E3 and E4 is VSS. It is sufficient if the voltage value to be applied to the gates of the P-type transistors E1 and E2, and N-type transistors E3 and E4 causes the transistors to turn on, and is not limited to the reference voltage VREF. The voltage value to be applied to the gates the P-type transistors E1 and E2, and the voltage value to be applied to the gates of the N-type transistors E3 and E4 may be different from each other.

[2-2] Operation

An operation of the IREC 6 according to the second embodiment will be described below by using FIG. 4. Broken lines shown in FIG. 4 indicate an example of variations in the voltages of the nodes netA, netB, netC, and netD at the time of an operation of the IREC 6 according to the second embodiment.

In the level adjustment circuit 61, in the P-type transistors E1 and E2, the reference voltage VREF is applied to the gates, and the transistors E1 and E2 are in the on-state. A current is supplied to the node netA through the P-type transistor E1, and a current is supplied to the node netB through the P-type transistor E2. Thereby, at the time when the input signal IN changes from the level "L" to the level "H", the voltage of the node netA is discharged becomes higher than the first embodiment, and the voltage of the node netB is discharged becomes higher than the first embodiment. As a result, the amplitudes of the nodes netA and netB in the IREC 6 according to the second embodiment become smaller than the first embodiment.

In the level adjustment circuit 62, in the N-type transistors E3 and E4, the reference voltage VREF is applied to their gates, and the transistors E3 and E4 are in the on-state. Thereby, a current is discharged from the node netC through the N-type transistor E3, and a current is discharged from the node netD through the N-type transistor E4 irrespective of the input signal IN. Thereby, at the time when the input signal IN changes from the level "H" to the level "L", the voltage of the node netC is charged becomes lower than the first embodiment, and the voltage of the node netD is charged becomes lower than the first embodiment. As a result, the amplitudes of the nodes netC and netD in the IREC 6 according to the second embodiment become smaller than the first embodiment.

[2-3] Advantage of Second Embodiment

In the IREC 6, there is sometimes a case where charge/discharge of the internal nodes is not completed within the period when the amplitudes of the internal nodes are large at the time of a high-speed operation. Further, in the IREC 6, there is sometimes a case where variation in the operation immediately after startup occurs owing to the uncertainty of the voltages of the nodes netA, netB, netC, and netD at the time of startup.

Thus, the IREC 6 according to the second embodiment includes the level adjustment circuits 61 and 62.

The level adjustment circuit 61 makes the amplitudes of the nodes netA and netB smaller than the first embodiment. The level adjustment circuit 62 makes the amplitudes of the nodes netC and netD smaller than the first embodiment. Thereby, the IREC 6 can complete charge/discharge of the nodes netA, netB, netC, and netD within the period at the time of a high-speed operation.

Further, in the IREC 6, immediately after startup, the level adjustment circuit 61 supplies currents to the nodes netA and netB, and the level adjustment circuit 62 discharges currents from the nodes netC and netD. Thereby, the uncertainty of the voltages of the nodes netA, netB, netC, and netD at the time immediately after startup is resolved, and the operation of the IREC 6 becomes stable.

By virtue of the configuration described above, the IREC 6 according to the second embodiment can complete charge/discharge of the internal nodes within the period in the higher operation range than the first embodiment.

[3] Third Embodiment

An IREC 6 according to a third embodiment, as shown in FIG. 6, has a circuit configuration identical to the configuration of the IREC 6 according to the second embodiment in which the discharge circuit 51 and the charge circuit 52 are not provided. By such a configuration, the IREC 6 according to the third embodiment can resolve the uncertainty of the voltages of the nodes netA, netB, netC, and netD at the time immediately after startup as in the second embodiment.

[4] Fourth Embodiment

An IREC 6 according to a fourth embodiment is a one-input amplifier circuit. The IREC 6 according to the fourth embodiment includes, in the IREC 6 described in the first embodiment, only one of the amplifier circuits 11 and 12. In the following, points different from the first to third embodiments will be described.

A configuration example 4-1 of the IREC 6 according to the fourth embodiment will be described below by using FIG. 7. The IREC 6 of the configuration example 4-1 is constituted of an amplifier circuit 11 configured to receive an input signal IN by using an N-type transistor, and includes an amplifier circuit 11, current mirror circuits 21, 22, and 26, input assist circuits 31 and 32, and discharge circuit 51.

The current mirror circuit 26 includes N-type transistors A15 and A16. In the N-type transistor A15, a gate and drain thereof are electrically connected to a drain of a P-type transistor A10, and a source thereof is connected to a ground terminal. In the N-type transistor A16, a gate thereof is electrically connected to the gate of the N-type transistor A15, a drain thereof is electrically connected to a drain of a P-type transistor A9, and a source thereof is electrically connected to a ground terminal. An output signal OUT is output from the drain of the P-type transistor A9 to the outside of the IREC 6. The connection relationships between other constituent elements are identical to the first to third embodiments.

It should be noted that the voltage value applied to the ground terminals electrically connected to the N-type transistors A15 and A16 is VSS.

Figure 8:
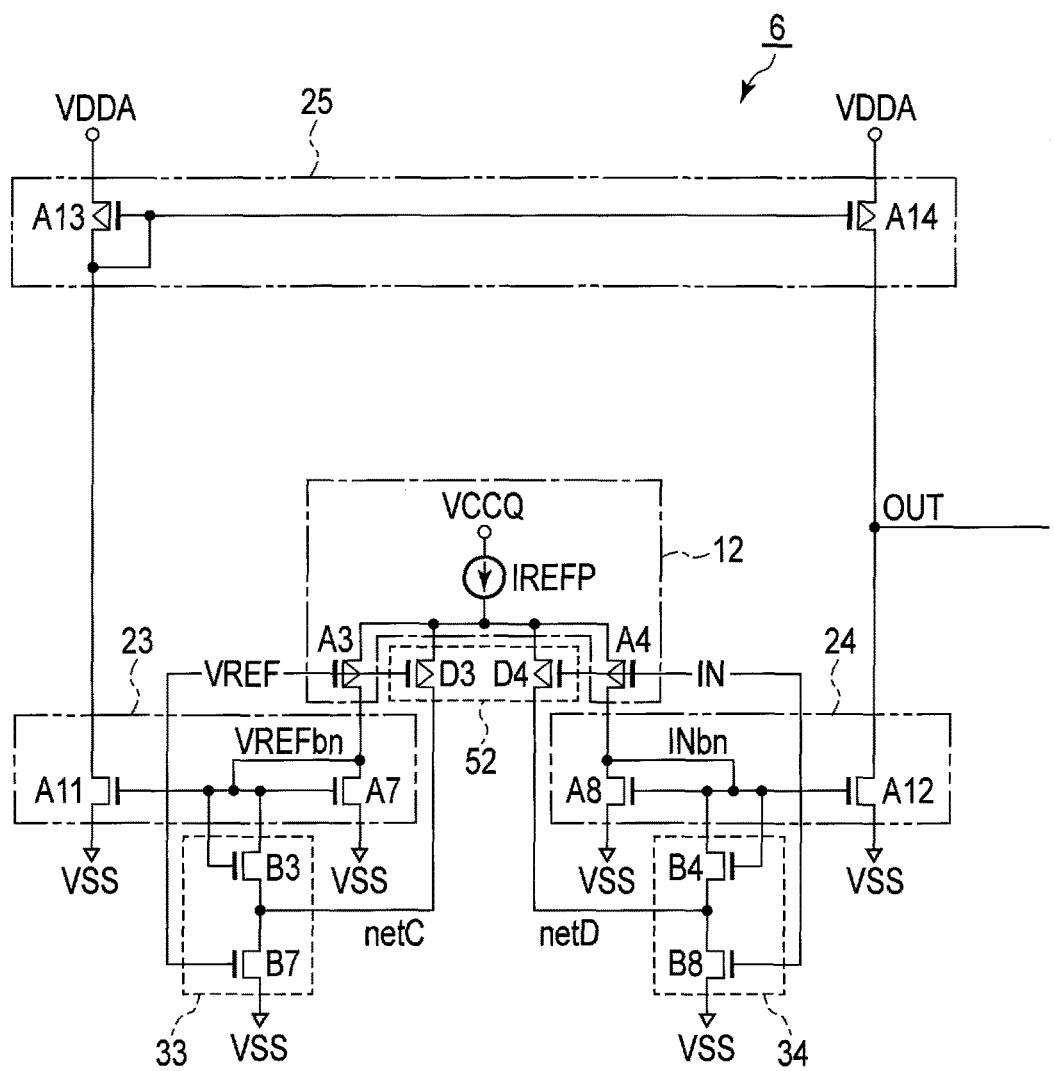

A configuration example 4-2 of the IREC 6 according to the fourth embodiment will be described below by using FIG. 8. The IREC 6 of the configuration example 4-2 is constituted of an amplifier circuit 12 configured to receive an input signal IN by using a P-type transistor, and includes an amplifier circuit 12, current mirror circuits 23, 24, and 25, input assist circuits 33 and 34, and charge circuit 52. An output signal OUT is output from a drain of a P-type transistor A14 to the outside of the IREC 6. The connection relationships between these constituent elements are identical to the first to third embodiments.

By virtue of the configurations described above, the IREC 6 according to the fourth embodiment can obtain an advantage identical to the first embodiment in both the cases of the configuration examples 4-1 and 4-2. Further, in the IREC 6 according to the fourth embodiment, the number of transistors is smaller than the first embodiment, and hence the area of the circuit of the IREC 6 can be made smaller.

[5] Fifth Embodiment

An IREC 6 according to a fifth embodiment is a one-input amplifier circuit, and the IREC 6 according to the fifth embodiment includes, in the IREC 6 described in the second embodiment, only one of the amplifier circuits 11 and 12. In the following, points different from the first to fourth embodiments will be described.

A configuration example 5-1 of the IREC 6 according to the fifth embodiment will be described below by using FIG. 9. The IREC 6 of the configuration example 5-1 includes an amplifier circuit 11, current mirror circuits 21, 22, and 26, input assist circuits 31 and 32, discharge circuit 51, and level adjustment circuit 61. The connection relationships between these constituent elements are identical to the first to fourth embodiments.

A configuration example 5-2 of the IREC 6 according to the fifth embodiment will be described below by using FIG. 10. The IREC 6 of the configuration example 5-2 includes an amplifier circuit 12, current mirror circuits 23, 24, and 25, input assist circuits 33 and 34, charge circuit 52, and level adjustment circuit 62. The connection relationships between these constituent elements are identical to the first to fourth embodiments.

By virtue of the configurations described above, the IREC 6 according to the fifth embodiment can obtain an advantage identical to the second embodiment in both the cases of the configuration examples 5-1 and 5-2. Further, in the IREC 6 according to the fifth embodiment, the number of transistors is smaller than the second embodiment, and hence the area of the circuit of the IREC 6 can be made smaller.

[6] Sixth Embodiment

An IREC 6 according to a sixth embodiment is a one-input amplifier circuit, and the IREC 6 according to the sixth embodiment includes, in the IREC 6 described in the third embodiment, only one of the amplifier circuits 11 and 12. In the following, points different from the first to fifth embodiments will be described.

A configuration example 6-1 of the IREC 6 according to the sixth embodiment will be described below by using FIG. 11. The IREC 6 of the configuration example 6-1 includes an amplifier circuit 11, current mirror circuits 21, 22, and 26, input assist circuits 31 and 32, and level adjustment circuit 61. The connection relationships between these constituent elements are identical to the first to fifth embodiments.

A configuration example 6-2 of the IREC 6 according to the sixth embodiment will be described below by using FIG. 12. The IREC 6 of the configuration example 6-2 includes an amplifier circuit 12, current mirror circuits 23, 24, and 25, input assist circuits 33 and 34, and level adjustment circuit 62. The connection relationships between these constituent elements are identical to the first to fifth embodiments.

By virtue of the configurations described above, the IREC 6 according to the sixth embodiment can obtain an advantage identical to the third embodiment in both the cases of the configuration examples 6-1 and 6-2. Further, in the IREC 6 according to the sixth embodiment, the number of transistors is smaller than the third embodiment, and hence the area of the circuit of the IREC 6 can be made smaller.

It should be noted that the above-mentioned embodiments includes the following contents.

A memory cell array formation as disclosed in U.S. patent application Ser. No. 12/532,030 filed on Mar. 23, 2009, the entire contents of which are incorporated by reference herein.

Furthermore, a memory cell array formation as disclosed in U.S. patent application Ser. No. 12/679,991 filed on Mar. 25, 2010, the entire contents of which are incorporated by reference herein.

Furthermore, a memory cell array formation as disclosed in U.S. patent application Ser. No. 12/406,524 filed on Mar. 18, 2009, the entire contents of which are incorporated by reference herein.

Furthermore, a memory cell array formation as disclosed in U.S. patent application Ser. No. 12/407,403 filed on Mar. 19, 2009, the entire contents of which are incorporated by reference herein.

<1>
A semiconductor device comprising:
a first circuit including a first transistor of a first conductivity type and a second transistor of the first conductivity type, a gate of the first transistor being supplied a first signal, a gate of the second transistor receiving a second signal, the first circuit amplifying a difference between the first signal and the second signal;

a second circuit including a third transistor of a second conductivity type and a fourth transistor of the second conductivity type,
a gate and one end of the third transistor being electrically connected to one end of the first transistor,
a gate of the fourth transistor receiving the first signal, one end of the fourth transistor being electrically connected to the other end of the third transistor; and
a fifth transistor of the second conductivity type, a gate of the fifth transistor receiving a third signal, one end of the fifth transistor being electrically connected the one end of the fourth transistor, and the other end of the fifth transistor being electrically connected to a power-supply terminal.

<2>
The semiconductor device according to <1>, further comprising:
a third circuit including a sixth transistor of the second conductivity type and a seventh transistor of the second conductivity type,
a gate and one end of the sixth transistor being electrically connected to the one end of the second transistor, a gate of the seventh transistor receiving the second signal, and one end of the seventh transistor being electrically connected to the other end of the sixth transistor; and
an eighth transistor of the second conductivity type, a gate of the eighth transistor receiving the third signal, one end of the eighth transistor being electrically connected to the one end of the seventh transistor.

<3>
The semiconductor device according to <1>, further comprising:
a first current mirror circuit electrically connected to the one end of the first transistor;
a second current mirror circuit electrically connected to the one end of the second transistor; and
a third current mirror circuit electrically connected to the first current mirror circuit, and the second current mirror circuit.

<4>
The semiconductor device according to <3>, wherein
the first current mirror circuit includes a ninth transistor of the second conductivity type and a tenth transistor of the second conductivity type, a gate and one end of the ninth transistor being electrically connected to the one end of the first transistor, a gate of the tenth transistor being electrically connected to the gate of the ninth transistor,
the second current mirror circuit includes an eleventh transistor of the second conductivity type and a twelfth transistor of the second conductivity type, a gate and one end of the eleventh transistor being electrically connected to the one end of the second transistor, a gate of the twelfth transistor being electrically connected to the gate of the eleventh transistor, and
the third current mirror circuit includes a thirteenth transistor of the first conductivity type and a fourteenth transistor of the first conductivity type, a gate and one end of the thirteenth transistor being electrically connected to one end of the twelfth transistor, a gate of the fourteenth transistor being electrically connected to the gate of the thirteenth transistor, one end of the fourteenth transistor is electrically connected to one end of the tenth transistor.

<5>
The semiconductor device according to <1>, wherein
regarding the first conductivity type and the second conductivity type, one is an N-type, and the other is a P-type.

<6>

The semiconductor device according to <1>, wherein one of the first signal and the second signals, is an input signal from outside, and the other is a reference voltage.

<7>

The semiconductor device according to <6>, wherein the third signal is substantially identical to the reference voltage.

<8>

A semiconductor device comprising:

a first amplifier circuit including a first N-type transistor and a second N-type transistor, a gate of the first N-type transistor being capable of receiving a first signal, a gate of the second transistor being capable of receiving a second signal;

a second amplifier circuit including a first P-type transistor and a second P-type transistor, the first P-type transistor being capable of receiving the first signal, a gate of the second P-type transistor being capable of receiving the second signal;

a first current mirror circuit electrically connected to one end of the first N-type transistor;

a second current mirror circuit electrically connected to one end of the second N-type transistor;

a third current mirror circuit electrically connected to one end of the first P-type transistor;

a fourth current mirror circuit electrically connected to one end of the second P-type transistor;

a fifth current mirror circuit electrically connected to the third and fourth current mirror circuits;

a first input assist circuit including a third P-type transistor and a fourth P-type transistor, a gate and one end of the third P-type transistor being electrically connected to the one end of the first N-type transistor, the fourth P-type transistor being capable of receiving the first signal, one end of the fourth P-type transistor being electrically connected to the other end of the third P-type transistor;

a second input assist circuit including a fifth P-type transistor and a sixth P-type transistor, a gate and one end of the fifth P-type transistor being electrically connected to the one end of the second N-type transistor, the sixth transistor being capable of receiving the second signal, one end of the sixth transistor being electrically connected to the other end of the fifth P-type transistor;

a third input assist circuit including a third N-type transistor and a fourth N-type transistor, a gate and one end of the third N-type transistor being electrically connected to the one end of the first P-type transistor, the fourth N-type transistor being capable of receiving the first signal, one end of the fourth N-type transistor being electrically connected the other end of the third N-type transistor;

a fourth input assist circuit including a fifth N-type transistor and a sixth N-type transistor, a gate and one end of the fifth N-type transistor being electrically connected to the one end of the second P-type transistor, the sixth N-type transistor being capable of receiving the second signal, and one end of the sixth N-type transistor being electrically connected to the other end of the fifth N-type transistor;

a first level adjustment circuit including a ninth P-type transistor and a tenth P-type transistor, the ninth P-type transistor being capable of receiving a third signal, one end of the ninth P-type transistor being electrically connected to the one end of the fourth P-type transistor, the tenth P-type transistor being capable of receiving the third signal, one end of the tenth P-type transistor being electrically connected to the one end of the sixth P-type transistor; and a second level adjustment circuit including a ninth N-type transistor and a tenth N-type transistor, the ninth N-type transistor being capable of receiving a fourth signal, one end of the ninth N-type transistor being electrically connected to the one end of the fourth N-type transistor, the tenth N-type transistor being capable of receiving the fourth signal, one end of the tenth N-type transistor being electrically connected to the one end of the sixth N-type transistor.

<9>

The semiconductor device according to <8>, wherein the third signal is substantially identical to the fourth signal.

<10>

The semiconductor device according to <8>, wherein one of the first signal and the second signals, is an input signal from outside, and the other is a reference voltage.

<11>

The semiconductor device according to <8>, wherein the third signal is substantially identical to the reference voltage.

<12>

The semiconductor device according to <8>, wherein the first current mirror circuit includes an eleventh P-type transistor and a twelfth P-type transistor, a gate and one end of the eleventh P-type transistor being electrically connected to the one end of the first N-type transistor, a gate of the twelfth P-type transistor being electrically connected to the gate of the eleventh P-type transistor, the second current mirror circuit includes a thirteenth P-type transistor and a fourteenth P-type transistor, a gate and one end of the thirteenth P-type transistor being electrically connected to the one end of the second N-type transistor, a gate of the fourteenth P-type transistor being electrically connected to the gate of the thirteenth P-type transistor, the third current mirror circuit includes an eleventh N-type transistor and a twelfth N-type transistor, a gate and one end of the eleventh N-type transistor being electrically connected to the one end of the first P-type transistor, a gate of the twelfth N-type transistor being electrically connected to the gate of the eleventh N-type transistor, and one end of the fourteenth P-type transistor, the fourth current mirror circuit includes a thirteenth N-type transistor and a fourteenth N-type transistor, a gate and one end of the thirteenth N-type transistor being electrically connected to the one end of the second P-type transistor, a gate of the fourteenth N-type transistor being electrically connected to the gate of the thirteenth N-type transistor, and one end of the twelfth P-type transistor, and the fifth current mirror circuit includes a fifteenth P-type transistor and a sixteenth P-type transistor, a gate and one end of the fifteenth P-type transistor being electrically connected to one end of the twelfth N-type transistor, a gate of the sixteenth P-type transistor being electrically connected to the gate of the fifteenth P-type transistor, and one end of the sixteenth P-type transistor being electrically connected to one end of the fourteenth N-type transistor.

<13>

The semiconductor device according to <12>, further comprising a parasitic capacitance cancel circuit including a first capacitor, a second capacitor, and an inverter, one end of the first capacitor being electrically connected to the gate of the fourteenth N-type transistor, one end of the second capacitor being electrically connected to the gate of the sixteenth P-type transistor, the other end of the second capacitor being electrically connected to the other end of the first capacitor, and an input terminal of the inverter being electrically connected to the one end of the sixteenth P-type transistor, and an output terminal of the inverter being electrically connected to the other end of the first capacitor.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a first circuit including a first transistor of a first conductivity type, a second transistor of the first conductivity type and a constant current source, the first transistor being capable of receiving a first signal, the second transistor being capable of receiving a second signal, one end of the constant current source being electrically connected to one end of the first transistor and one end of the second transistor;
a second circuit including a third transistor of a second conductivity type and a fourth transistor of the second conductivity type, a gate and one end of the third transistor being electrically connected to the other end of the first transistor, the fourth transistor being capable of receiving the first signal, one end of the fourth transistor being electrically connected to the other end of the third transistor; and
a third circuit configured to charge or discharge a node being electrically connected to the one end of the first transistor according to the first signal.

2. The device of claim 1, wherein
the third circuit includes a fifth transistor of the first conductivity type, the fifth transistor being capable of receiving the first signal, one end of the fifth transistor being electrically connected to the one end of the fourth transistor.

3. The device of claim 2, further comprising a sixth transistor of the second conductivity type, the sixth transistor being capable of receiving a third signal, one end of the sixth transistor being electrically connected to the one end of the fourth transistor, the other end of the sixth transistor being electrically connected to a power-supply terminal.

4. The device of claim 1, further comprising a fourth circuit including a fifth transistor of the second conductivity type and a sixth transistor of the second conductivity type, a gate and one end of the fifth transistor being electrically connected to the other end of the second transistor, the sixth transistor being capable of receiving the second signal, one end of the sixth transistor being electrically connected to the other end of the fifth transistor, wherein
the third circuit configured to charge or discharge a node being electrically connected to the one end of the second transistor according to the first signal.

5. The device of claim 4, wherein
the third circuit includes a seventh transistor of the first conductivity type and an eighth transistor of the first conductivity type, the seventh transistor being capable of receiving the first signal, one end of the seventh transistor being electrically connected to the one end of the fourth transistor, the eighth transistor being capable of receiving the second signal, one end of the eighth transistor being electrically connected to the one end of the sixth transistor.

6. The device of claim 5, further comprising a fifth circuit including a ninth transistor of the second conductivity type and a tenth transistor of the second conductivity type, the ninth transistor being capable of receiving the third signal, one end of the ninth transistor being electrically connected to the one end of the fourth transistor, the other end of the ninth transistor being electrically connected to a power-supply terminal, the tenth transistor being capable of receiving the third signal, one end of the tenth transistor being electrically connected to the one end of the sixth transistor, the other end of the tenth transistor being electrically connected to the power-supply terminal.

7. The device of claim 1, further comprising:
a first current mirror circuit electrically connected to the other end of the first transistor;
a second current mirror circuit electrically connected to the other end of the second transistor; and
a third current mirror circuit electrically connected to the first current mirror circuit, and the second current mirror circuit.

8. The device of claim 7, wherein
the first current mirror circuit includes an eleventh transistor of the second conductivity type and a twelfth transistor of the second conductivity type, a gate and one end of the eleventh transistor being electrically connected to the other end of the first transistor, a gate of the twelfth transistor being electrically connected to the gate of the eleventh transistor,
the second current mirror circuit includes a thirteenth transistor of the second conductivity type and a fourteenth transistor of the second conductivity type, a gate and one end of the thirteenth transistor being electrically connected to the other end of the second transistor, a gate of the fourteenth transistor being electrically connected to the gate of the thirteenth transistor, and
the third current mirror circuit includes a fifteenth transistor of the first conductivity type a sixteenth transistor of the first conductivity type, a gate and one end of the fifteenth transistor being electrically connected to one end of the fourteenth transistor, a gate of the sixteenth transistor being electrically connected to the gate of the fifteenth transistor, and one end of the sixteenth transistor being electrically connected to one end of the twelfth transistor.

9. The device of claim 1, wherein
regarding the first conductivity type and the second conductivity type, one is an N-type, and the other is a P-type.

10. The device of claim 1, wherein
one of the first signal and the second signals is an input signal from outside, and the other is a reference voltage.

11. The device of claim 10, wherein
the third signal is substantially identical to the reference voltage.

12. A semiconductor device comprising:
a first amplifier circuit including a first N-type transistor and a second N-type transistor, the first N-type transistor being capable of receiving a first signal, the second N-type transistor being capable of receiving a second signal;
a second amplifier circuit including a first P-type transistor and a second P-type transistor, the first P-type transistor being capable of receiving the first signal, the second P-type transistor being capable of receiving the second signal;
a first current mirror circuit electrically connected to one end of the first N-type transistor;
a second current mirror circuit electrically connected to one end of the second N-type transistor;
a third current mirror circuit electrically connected to one end of the first P-type transistor;
a fourth current mirror circuit electrically connected to one end of the second P-type transistor;
a fifth current mirror circuit electrically connected to the third and fourth current mirror circuits;
a first input assist circuit including a third P-type transistor and a fourth P-type transistor, a gate and one end of the third transistor being electrically connected to the one end of the first N-type transistor, the fourth P-type transistor being capable of receiving the first signal, one end of the fourth P-type transistor being electrically connected to the other end of the third P-type transistor;
a second input assist circuit including a fifth P-type transistor and a sixth P-type transistor, a gate and one end of the fifth P-type transistor being electrically connected to the one end of the second N-type transistor, the sixth P-type transistor being capable of receiving the second signal, one end of the sixth P-type transistor being electrically connected to the other end of the fifth P-type transistor;
a third input assist circuit including a third N-type transistor and a fourth N-type transistor, a gate and one end of the third N-type transistor being electrically connected to the one end of the first P-type transistor, the fourth N-type transistor being capable of receiving the first signal, one end of the fourth N-type transistor being electrically connected the other end of the third N-type transistor;
a fourth input assist circuit including a fifth N-type transistor and a sixth N-type transistor, a gate and one end of the fifth N-type transistor being electrically connected to the one end of the second P-type transistor, the sixth N-type transistor being capable of receiving the second signal, one end of the sixth N-type transistor being electrically connected to the other end of the fifth N-type transistor;
a discharge circuit including a seventh N-type transistor and an eighth N-type transistor, the seventh N-type transistor being capable of receiving the first signal, one end of the seventh N-type transistor being electrically connected to the one end of the fourth P-type transistor, the other end of the seventh N-type transistor being electrically connected to the other end of the first N-type transistor, the eighth transistor being capable of receiving the second signal, one end of the eighth transistor being electrically connected to the one end of the sixth P-type transistor, and the other end of the eighth transistor being electrically connected to the other end of the second N-type transistor; and
a charge circuit including a seventh P-type transistor and an eighth P-type transistor, the seventh P-type transistor being capable of receiving the first signal, one end of the seventh P-type transistor being electrically connected to the one end of the fourth N-type transistor, the other end of the seventh P-type transistor being electrically connected to the other end of the first P-type transistor, and the eighth P-type transistor being capable of receiving the second signal, one end of the eighth P-type transistor being electrically connected to the one end of the sixth N-type transistor, and the other end of the eighth transistor being electrically connected to the other end of the second P-type transistor.

13. The device of claim 12, wherein
one of the first signal and the second signals, is an input signal from outside, and the other is a reference voltage.

14. The device of claim 12, further comprising:
a first level adjustment circuit including a ninth P-type transistor and a tenth P-type transistor, the ninth P-type transistor being capable of receiving a third signal, one end of the ninth P-type transistor being electrically connected to the one end of the fourth P-type transistor, the tenth P-type transistor being capable of receiving the third signal, one end of the tenth P-type transistor being electrically connected to the one end of the sixth P-type transistor; and
a second level adjustment circuit including a ninth N-type transistor and a tenth N-type transistor, the ninth N-type transistor being capable of receiving a fourth signal, one end of the ninth N-type transistor being electrically connected to the one end of the fourth N-type transistor, the tenth N-type transistor being capable of receiving the fourth signal, one end of the tenth N-type transistor being electrically connected to the one end of the sixth N-type transistor.

15. The device of claim 14, wherein
the third signal is substantially identical to the fourth signal.

16. The device of claim 14, wherein
one of the first signal and the second signals, is an input signal from outside, and the other is a reference voltage.

17. The device of claim 16, wherein
the third signal is substantially identical to the reference voltage.

18. The device of claim 12, wherein
the first current mirror circuit includes an eleventh P-type transistor and a twelfth P-type transistor, a gate and one end of the eleventh P-type transistor being electrically connected to the one end of the first N-type transistor, a gate of the twelfth P-type transistor being electrically connected to the gate of the eleventh P-type transistor,
the second current mirror circuit includes a thirteenth P-type transistor and a fourteenth P-type transistor, a gate and one end of the thirteenth P-type transistor being electrically connected to the one end of the second N-type transistor, a gate of the fourteenth transistor being electrically connected to the gate of the thirteenth P-type transistor,
the third current mirror circuit includes an eleventh N-type transistor and a twelfth N-type transistor, a gate and one end of the eleventh N-type transistor being electrically connected to the one end of the first P-type transistor,
a gate of the twelfth N-type transistor being electrically connected to the gate of the eleventh N-type transistor, and one end of the fourteenth P-type transistor, the fourth current mirror circuit includes a thirteenth N-type transistor and a fourteenth N-type transistor, a gate and one end of the thirteenth N-type transistor being electrically connected to the one end of the second P-type transistor, a gate of the fourteenth transistor being electrically connected to the gate of the thirteenth N-type transistor, and one end of the twelfth P-type transistor, and the fifth current mirror circuit includes a fifteenth P-type transistor and a sixteenth P-type transistor, a gate and one end of the fifteenth P-type transistor being electrically connected to one end of the twelfth N-type transistor, a gate of the sixteenth P-type transistor being electrically connected to the gate of the fifteenth P-type transistor, one end of the sixteenth P-type transistor being electrically connected to one end of the fourteenth N-type transistor.

19. The device of claim 18, further comprising a parasitic capacitance cancel circuit including a first capacitor, a second capacitor, and an inverter, one end of the first capacitor being electrically connected to the gate of the fourteenth N-type transistor, one end of the second capacitor being electrically connected to the gate of the sixteenth P-type transistor, the other end of the second capacitor being electrically connected to the other end of the first capacitor, an input terminal of the inverter being electrically connected to the one end of the sixteenth P-type transistor, an output terminal of the inverter being electrically connected to the other end of the first capacitor.

* * * * *